United States Patent [19]

Oguri

[11] Patent Number: 5,410,673
[45] Date of Patent: Apr. 25, 1995

[54] METHOD AND APPARATUS FOR SIMULATING A LOGIC CIRCUIT HAVING A PLURALITY OF INTERCONNECT LOGIC BLOCKS

[75] Inventor: Sumio Oguri, Itami, Japan

[73] Assignee: Mitsubishi Denki Kabushiki Kaisha, Tokyo, Japan

[21] Appl. No.: 758,050

[22] Filed: Sep. 12, 1991

[51] Int. Cl.⁶ .............................................. G06F 15/20
[52] U.S. Cl. ................................ 395/500; 364/264.3; 364/264.2; 364/254.5; 364/DIG. 1
[58] Field of Search .................. 395/500, 800; 364/578

[56] References Cited

U.S. PATENT DOCUMENTS

| | | | |
|---|---|---|---|
| 4,583,169 | 4/1986 | Cooledge | 395/700 |
| 4,763,288 | 8/1988 | Deering | 364/578 |
| 4,815,016 | 3/1989 | Young | 364/578 |
| 4,924,430 | 5/1990 | Zasio | 364/578 |
| 4,937,770 | 6/1990 | Samuels | 364/578 |
| 5,095,454 | 3/1992 | Huang | 364/578 |
| 5,210,700 | 5/1993 | Tom | 364/489 |

*Primary Examiner*—Eric Coleman
*Attorney, Agent, or Firm*—Lowe, Price, LeBlanc & Becker

[57] ABSTRACT

A computer program-implemented logic circuit simulation receives data describing the configuration of a logic circuit to be simulated, and a library of component characteristics incorporated in the circuit. Signals are classified as a first type always to be "watched" or as a second type to be evaluated only upon transition of a watched signal to an activated logic state. The circuit is partitioned into evaluation blocks, each one containing components and input lines thereto carrying only signals to be evaluated. The content of the block is simulated by "lump simulation", i.e., Boolean calculation, in response to a change to the activated logic state in the watched signal for the block. The maximum delay associated with the block is compared to the difference between the present time and the time of change of the watched signal to the activated state. If the maximum delay is greater, because a change of input will not have fully propagated to the output of the block, conventional simulation by time-wheel control rather than lump simulation, is carried out. The conventional simulation, although slower, enables logic states of all components of the block to be determined.

3 Claims, 7 Drawing Sheets

Figure 9
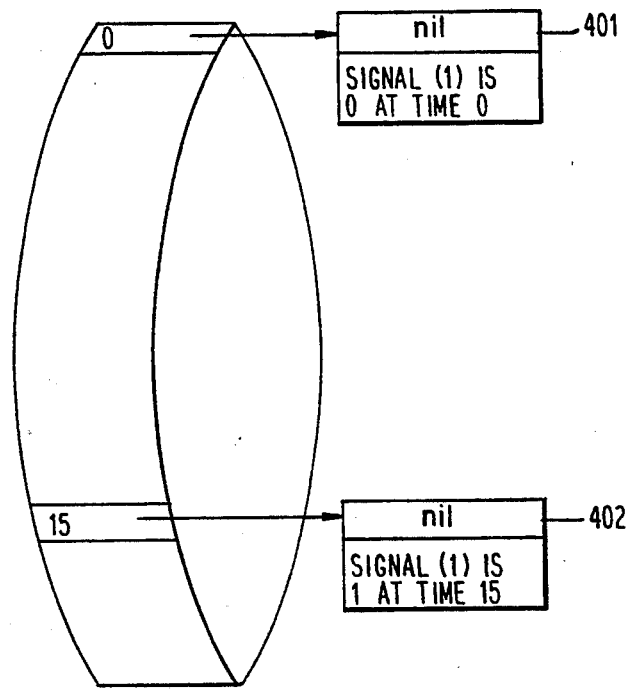
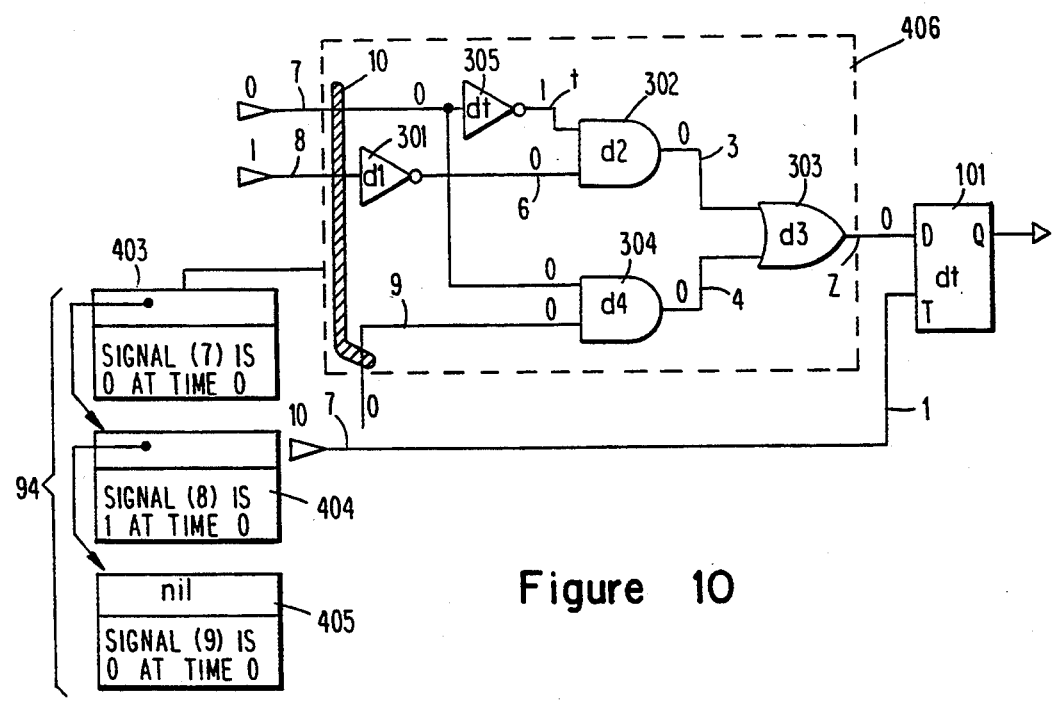
Figure 10

METHOD AND APPARATUS FOR SIMULATING A LOGIC CIRCUIT HAVING A PLURALITY OF INTERCONNECT LOGIC BLOCKS

TECHNICAL FIELD

This invention relates generally to logic simulation, and more particularly, to improved logic simulation based upon the semantics description method.

BACKGROUND ART

A logic simulator, a device using software to simulate the activity of a logic circuit, makes it possible to evaluate the performance of a circuit without building it. For example, the feasibility of a design may be verified by simulation in order to check that the correct logic functions are performed and to locate any timing problems. Simulation also will enable the performance of a circuit under fault conditions to be examined.

As circuit designs continue to grow in size and complexity, so do the demands placed upon logic simulators. To keep pace, work has been done to improve the basic performance of them. In so-called "event driven simulation", inputs to a computer primarily comprise a circuit representation, input stimuli and signal watch commands. For a description of fundamental event driven simulation, see Smith et al., "DEMAND DRIVEN SIMULATION: BACKSIM", 24th ACM/IEEE Design Automation Conference, Paper 11.1 (1987), pages 181–187 at 182. Processing tends to move from gate inputs to outputs and then onto the fan-out inputs driven by these outputs, always monotonically forward in time.

Types of event driven simulation include the "selective event method" and a "processing semantics description", described in Inagaki et al., "SIM/D: A LOGIC SIMULATOR FOR HIERARCHICAL DIGITAL SYSTEM CONTAINING LSI'S", Jyohousyori Gakki Ronbunshi Volume 12, No. 4 (1980), pages 332–339. The selective event method is an improvement on selective trace techniques which evaluate gates when input values to them are changed. The selective event method watches not only changes of inputs to each gate but also changes of output, and evaluates the gates only when the output as well as input values change. In the processing semantics description method of simulation, a circuit is classified into hierarchical modules, and evaluation is performed going back in time from the highest order module to the lowest order module or modules that are activated.

Conventional event driven logic simulation is disadvantageous in that it is able only to avoid processing of some of the gates and modules comprising a circuit, that is, the ones to which there is a change in input but not in output. The processing semantics description technique is disadvantageous in that it requires a considerable amount of effort for dividing logic circuitry into modules and for assigning to each module its position in the hierarchy.

Logic simulation generally is carried out by a general purpose computer programmed to execute logic simulation software. Such a computer is shown schematically in FIG. 1 as comprising a central processing unit (CPU) 20 receiving all logic simulation inputs through a keyboard 22 and supplying outputs to a display 24 and printer 26. In some logic simulation systems, an additional input representing actual device characteristics may be supplied to the CPU 20 from an optional pod 28, housing a physical logic device. The system further includes a random access memory 30 for storing data and programming temporarily and, optionally, a non-volatile memory, such as EPROM 32, for storing firmware which may include instructions for executing a simulation algorithm.

An example showing how logic simulation is implemented in accordance with the prior art is given in FIG. 2 for a circuit 300 shown in FIG. 3. Each of the logic elements forming the circuit shown in FIG. 3 is characterized as having an internal delay d1–d6. In this example, inverter 301 is considered to have a delay value d1 of 3 delay units. Inverter 305 has a delay value d5 of 1 delay unit and gate 302 has a delay value d2 of 5 units. Gate 304 has a delay value d4 of 5 and gate 303 a delay value d3 of 2. The circuit 300 comprises input signal lines (1), (7), (8) and (9) and an output line (101a) at the Q output of a D-type flip-flop 101. To the D-input of flip-flop 101 and the output of OR gate 303 is connected a signal line (2). To one input of gate 303 is connected a signal line (3) supplied by the output of an AND gate 302. Another output, from AND gate 304, is connected to the other input of OR gate 303 through signal line (4). One input to AND gate 302 is connected to the output of an inverter 305 through signal line (5). The other input to AND gate 302 is connected to the output of inverter 301 through signal line (6). The AND gate 304 has one input connected to input signal line (7) and to the input of inverter 305. The other input of gate 304 is connected to input signal line (9). Input signal line (1) is supplied to a clock terminal T of flip-flop 101.

Operating characteristics of a logic circuit simulation frequently are described with reference to a so-called "time-wheel". See, for example, Ulrich et al., "TECHNIQUES FOR LOGIC AND FAULT SIMULATION", VLSI System Design, October 1986, pages 68–81. A time-wheel depicts scheduled events at a fixed CPU time per event, regardless of the number of events already scheduled. A time-wheel 306 corresponding to the circuit of FIG. 3 is shown in FIG. 2. It consists of "time slots" 1 ... 15 corresponding to 16 counts of a system clock (not shown). Events depicted as blocks 307–316 correspond to signal changes as they occur during operation of circuit 300 in response to the input signals shown.

Assume that signals applied to input signal lines (1), (7), (8) and (9) initially are at logic states 0, 0, 1, 0, respectively, and that the signal on input signal line (1) is to be changed from a 0 to a 1 at time t=15. As is characteristic of a D-type flip-flop, the Q output of the flip-flop stores the input signal state applied to terminal D in response to the signal change at input line 1 connected to the clock terminal T of the flip-flop.

Initially, at time slot t=0 on the wheel, events 307, 308, 309 and 310, i.e., the initial input signal states 0, 0, 1, 0, are registered as shown. The gate 305 is simulated by event 308, and then the event 311 is registered at time slot t=1 since the delay d5 for gate 305 is 1. Also at time slot t=0, the gate 301 is simulated by the event 309. Event 312 is registered at time slot t=3 since the delay d1 for gate 301 is 3. Similarly, gate 304 is simulated by events 310 and 308, and the event 313 is registered at time slot t=5 since the delay associated with gate 304 is d4=5.

Gate 101 is simulated by event 307 at time slot t =0, but no new event is produced since there is no change in the output of gate 101 at the first transition of the system clock.

After fetching and processing all the time slot t=0 events, the time slot t=1 events are processed. Gate 302 is simulated by event 311, and when the signal on line (3) is attempted to be scheduled to have a particular value at time slot t=2 according to d2=5 delay units, no event is produced because the initial value of the signal on line (3) is at the same value.

After the processing for time slot t=1 is completed, events at time slot t=2 on the wheel 306 are processed. However, since nothing is scheduled at time slot t=2, the processing steps automatically to time slot t=3. At time slot t=3 on the wheel, gate 302 is simulated by event 312, and event 314 is registered at time slot t=8; this follows expiration of delays of 3 and 5 units, respectively, corresponding to inverter 301 and gate 302.

When processing associated with time slot t=3 is completed, time slot t=5 is processed. The gate 303 is simulated by event 313. However, since the initial value of the signal on line (3) remains unchanged, and the output of the gate is also unchanged, no event is produced.

Following processing associated with time slot t=5, time slot t=8 is processed. Gate 303 is simulated by event 314, and event 315 is registered at time slot t=10 corresponding to delays associated with inverter 301 and gates 302 and 303. Following processing at time slot t=10, simulated of gate 101 is attempted by event 315. However, since no output change of gate 101 occurs, because there has been no change of signal at the input line (1), no event is produced. Instead, gate 101 is simulated by event 316 at time slot t=15, when the signal on line (1) changes from 0 to 1. Input 0 is produced at the Q terminal at the output of flip-flop (101) following a time delay corresponding to d6.

Thus, based upon the circuitry shown in FIG. 3, using conventional simulation it is necessary to register and simulate ten different events. This requires a considerable amount of processing, and represents a limitation to the speed at which simulation can be carried out.

DISCLOSURE OF THE INVENTION

Accordingly, one object of the invention is to reduce processing time for logic simulation in a logic simulation apparatus.

Another object is to reduce the amount of processing required to carry out logic circuit simulation.

A further object is to provide logic circuit simulation without necessity for definition of modules and hierarchical assignments.

To achieve the above and other objects, a method of simulating a logic circuit in accordance with the invention comprises receiving data describing the configuration of a logic circuit to be simulated, and classifying signals associated with the circuit into first signals always to be monitored and second signals which are to be evaluated only when necessary. Only the second signals are evaluated in response to the logic states of the first signals.

In accordance with another aspect of the invention, the method comprises receiving data describing the configuration of a logic circuit to be simulated, and identifying at least one signal having an input pattern that changes state at a rate less than a predetermined rate. This signal is classified as a first signal which is always to be monitored. A group of second signals excluding the first signal is selected for evaluation, and the state of the second signal is evaluated only in response to a particular change of state of the first signal.

Preferably, the input pattern bearing a low rate of changing state is a clock signal pattern of the logic circuit. The step of evaluating includes detecting an "event" in the form of a change of state in the first signal, and removing the event from a time queue containing successive events. Whether the detected event satisfies a condition for evaluation is determined, and if so, the second signal is evaluated.

The logic circuit preferably is classified into as a plurality of blocks, each comprising at least one circuit component together with signal lines carrying at least some of the second signals but none of the first signals. Any change of output signal from the block is detected, and in response new events are registered into the time queue and circuit components are simulated by "lump simulation", i.e., Boolean calculation.

Preferably, lump simulation is carried out only if signals applied to all input terminals of the block have propagated to the output. Another aspect of the invention determines whether the maximum delay associated with the block exceeds the difference between the present time on the time of the next change of a watched signal. If so, conventional, rather than lumped, simulation, is executed.

Still other objects and advantages of the present invention will become readily apparent to those skilled in this art from the following detailed description, wherein only the preferred embodiment of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF DRAWINGS

FIG. 9 is a time-wheel in accordance with logic simulation in accordance with the present invention.

FIG. 10 is a diagram of the circuit of FIG. 3, simulated in accordance with the invention and as represented by the time-wheel of FIG. 9.

BEST MODE FOR CARRYING OUT THE INVENTION

The invention is a modification of the semantics description technique, wherein the circuit to be simulated is divided, not to define circuit modules, but in accordance with two types of signals, one that is always "watched" and the other used for "evaluation", i.e., calculation, only in response to a change of logic state the watched signal. The change is processed by "lump"

simulation (Boolean calculation) of a block of elements that includes only evaluated signals, rather than by conventional state-by-state simulation under time-wheel control. Only if a watched signal undergoes change to an activated logic state before an input signal has propagated to the output of a block, or comprehensive processing of the entire block is requested by the user, is conventional processing carried out. The invention conserves a considerable amount of processing time by minimizing overhead associated with time-wheel control and eliminating numerous calculations required by block simulation.

Figure 1:
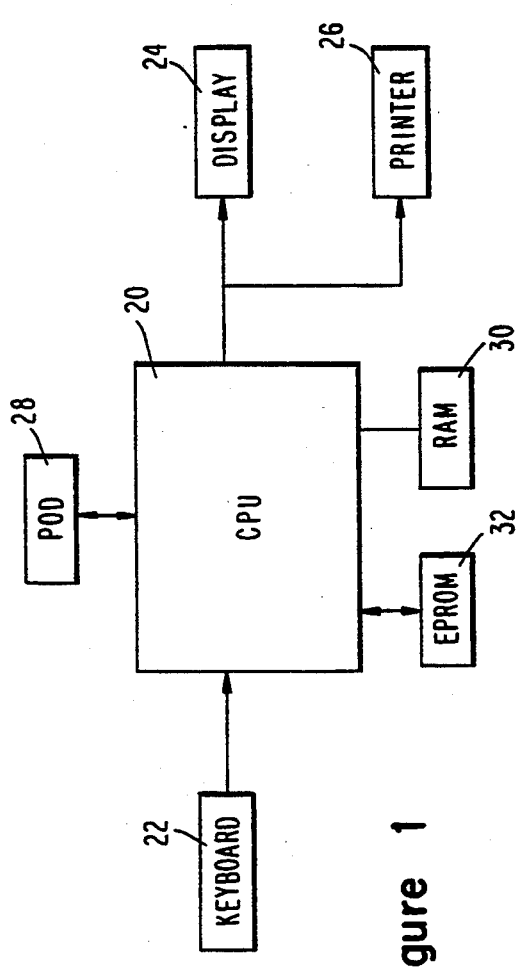
FIG. 1 is a diagram of a conventional data processing system programmed to implement logic simulation in accordance with the invention.

A signal having a relatively stable pattern, i.e., one changing state at a rate less than a predetermined state, is selected as the watched signal. The watched signal is identified during a routine, shown in FIG. 5, that is executed prior to execution of the logic simulation algorithm of this invention. In accordance with the routine of FIG. 5, executed by a computer such as is shown in FIG. 1, information describing interconnections of devices and patterns of signals flowing between them are analyzed to identify signals having a low rate of logic state transitions. Watched and evaluation signals are identified and an evaluation block is defined.

More specifically, step 51 of the routine reads circuit information into the computer shown in FIG. 1. The circuit information includes data describing each logic circuit element and interconnections among them. For example, a library of data describing the content and characteristics of each component is included in the circuit information read to the computer. This information identifies which input terminals receive clock and other particular signals, as well as the characteristics, e.g., expected rate of logic state transitions, of each particular signal.

If a clock signal has been identified from the library of component data, step 52 of the routine extracts the clock signal to be used as a low transition rate signal to be watched. Otherwise, signals that are ascertained to undergo a change of state relatively infrequently are identified and selected as being watched signals (step 53). Signals which are not selected as being watched signals are selected as signals for evaluation (step 54).

A block including components of the circuit receiving only evaluation signals is defined in step 55. A condition for evaluation of the block is next established in step 56, i.e., using the library data received during step 51, a particular signal change applied to a circuit component at a boundary of the block that will enable the block to pass a signal to subsequent circuitry is ascertained. This signal change, termed an "event" when it occurs during execution of the simulation algorithm described by FIGS. 6–8, will trigger "lump simulation" of the content of the block, i.e., evaluation of the block using Boolean calculation. The largest delay time for each block is then determined (step 57).

Figure 3:
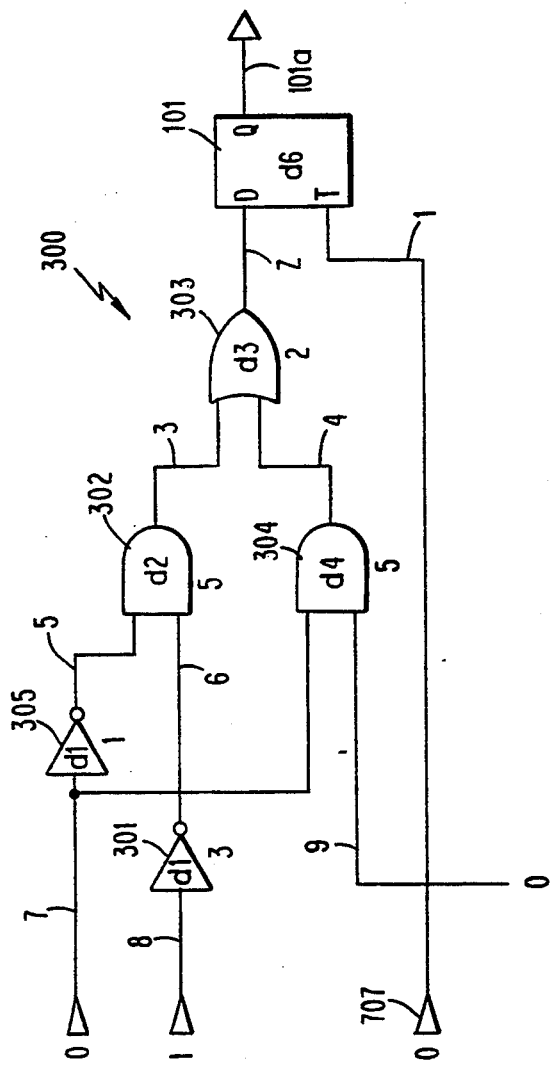
FIG. 3 is a logic circuit diagram simulated in accordance with the time-wheel of FIG. 2.
Figure 2:
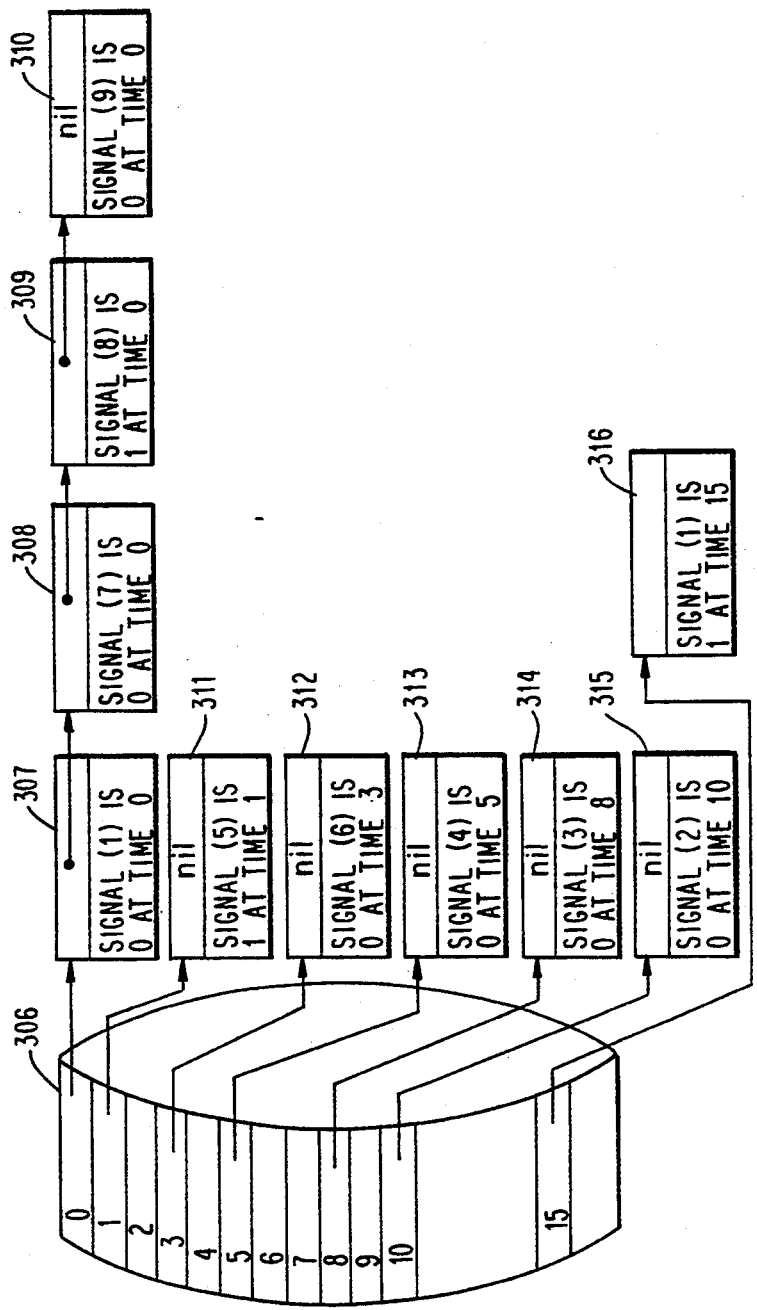
FIG. 2 is a time-wheel describing logic simulation in/accordance with a prior art method.
Figure 4:
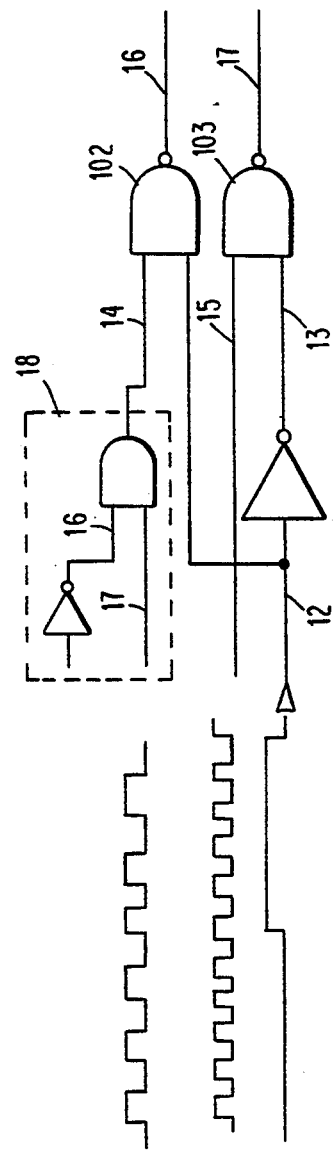
FIG. 4 is a circuit diagram showing how a signal having a low rate of change of state is selected as the signal which is always watched.

For example, in FIG. 10 which is a circuit diagram corresponding to FIG. 3, the input signal on line (1) applied to the clock input terminal T of flip-flop 101 is selected as the watched signal. Because the signal on line (1) is a clock signal for activation of flip-flop 101, it is selected as the watched signal automatically, that is, without necessity to identify from a signal that is suitable as a watched signal. A contrary example, shown in FIG. 4, provides two gates 102, 103, and a signal having a relatively low rate of change in pattern is supplied on lines (12) and (13) to one input of each gate. The signals applied to these lines are designated as being watched signals. The remaining signals, applied to lines (14) and (15) of the gates, are designated as being evaluation signals. These evaluation signals are to be evaluated only upon a change of state of the corresponding watched signals on lines (12) and (13).

In FIG. 10, all lines other than input line (1) are deemed to carry evaluation signals. The invention provides evaluation of these signals only upon a change of state of the watched signal on line (1) that will activate the flip-flop 101. Lines (2), (3), (4), (5), (6), (7), (8) and (9) in FIG. 10 all carry evaluation signals.

The evaluation signals, and their affiliated components, are located within a field or block 406 in FIG. 10 (see also block 18 in FIG. 4) defined in step 56. In FIG. 10, a borderline 10 representing a line of entry into the block 406 is also set. Calculation on the content of the block 406 takes place when the state of the watched signal on line (1) changes to 1. This particular condition is dictated by flip-flop 101, and may be different depending upon characteristics of the device receiving the watched signal, e.g., the device may be edge triggered, level sensitive, polarity sensitive, etc.

In the example of FIG. 4, with signal (16) and (17) being designated as evaluation signals, the content of block 18 is evaluated only when the watched signal on line (12) changes to an activated state. The activated state of the watched signal in the circuit of FIG. 4 is 1, since gates 102 and 103 are AND gates. As another example, if the gates are OR gates, the activated state of the watched signal would be 0. When whichever activated condition appropriate to particular circuitry is met, the calculation block is evaluated. Thus, block 18 in FIG. 4 is evaluated when the watched signal on line (12) attains a logic state of 1.

Continuing with the example of FIG. 10, step 57 calculates the largest delay time for each block. In FIG. 10, the greatest delay time between the input signals on lines (7), (8), (9) on the input and of evaluation block 406 and the signal on line (2) is estimated. For example, the delay time to which the signal on input line (8) as it propagates to line (2) is exposed is the sum of the delays associated with inverter 301, gate 302 and gate 303, i.e., d1+d2+d3 delay units. Any delay model, such as the unit type of delay, standard-delay, between-pin-delay, or greatest-least-delay, can be used to establish the delay evaluated. During simulation, any event on iput signal line (7), (8) or (9) crossing borderline 10 at the input to block 406 is stored in a time queue, as depicted by symbol 94 in FIG. 10.

Figure 6:
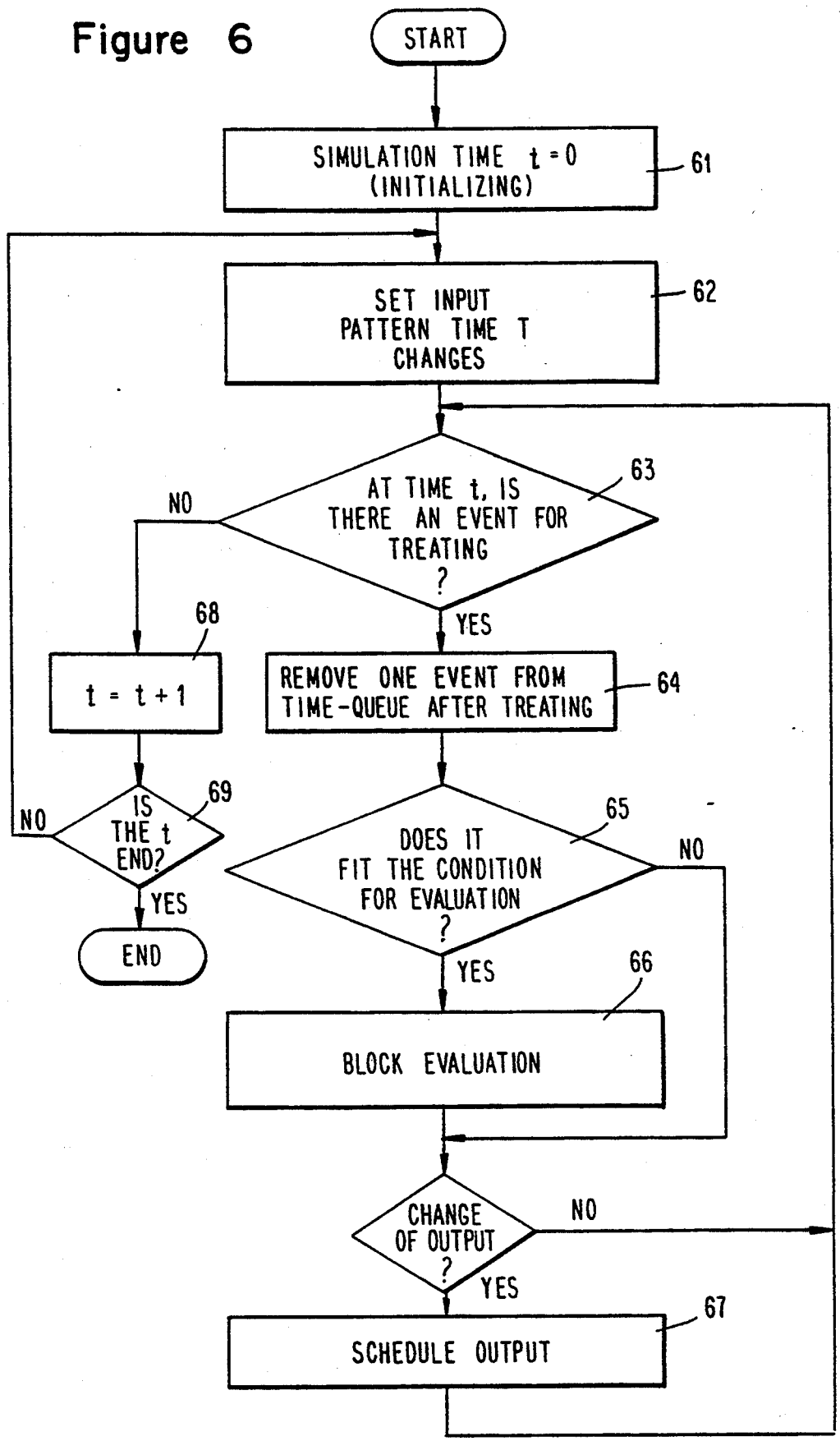

Logic simulation, carried out in accordance with the routine of FIG. 6, begins at step 61 with initialization (time t$_0$). Following initialization, arrival of an input pattern that may constitute an "event" is set at step 62. If an event requiring a block evaluation is determined to be taking place, step 63 removes the event from the time queue defining the order at which events will be processed (step 64).

Events next are examined to determine whether they satisfy a condition for evaluation, i.e., making a transition to an activated logic state (step 65). If the event is confirmed as being one satisfying a condition for evaluation, evaluation for the corresponding block is executed (step 66); this will be described in detail below with reference to FIG. 7. Following step 66, when a change of output signals occurs, scheduling (described below with reference to FIG. 8) is carried out to register new events into openings in the time queue.

Following handling of every event in the time queue, the time t is incremented by 1 (step 68), and then handling of the next queue is carried out.

Figure 7:
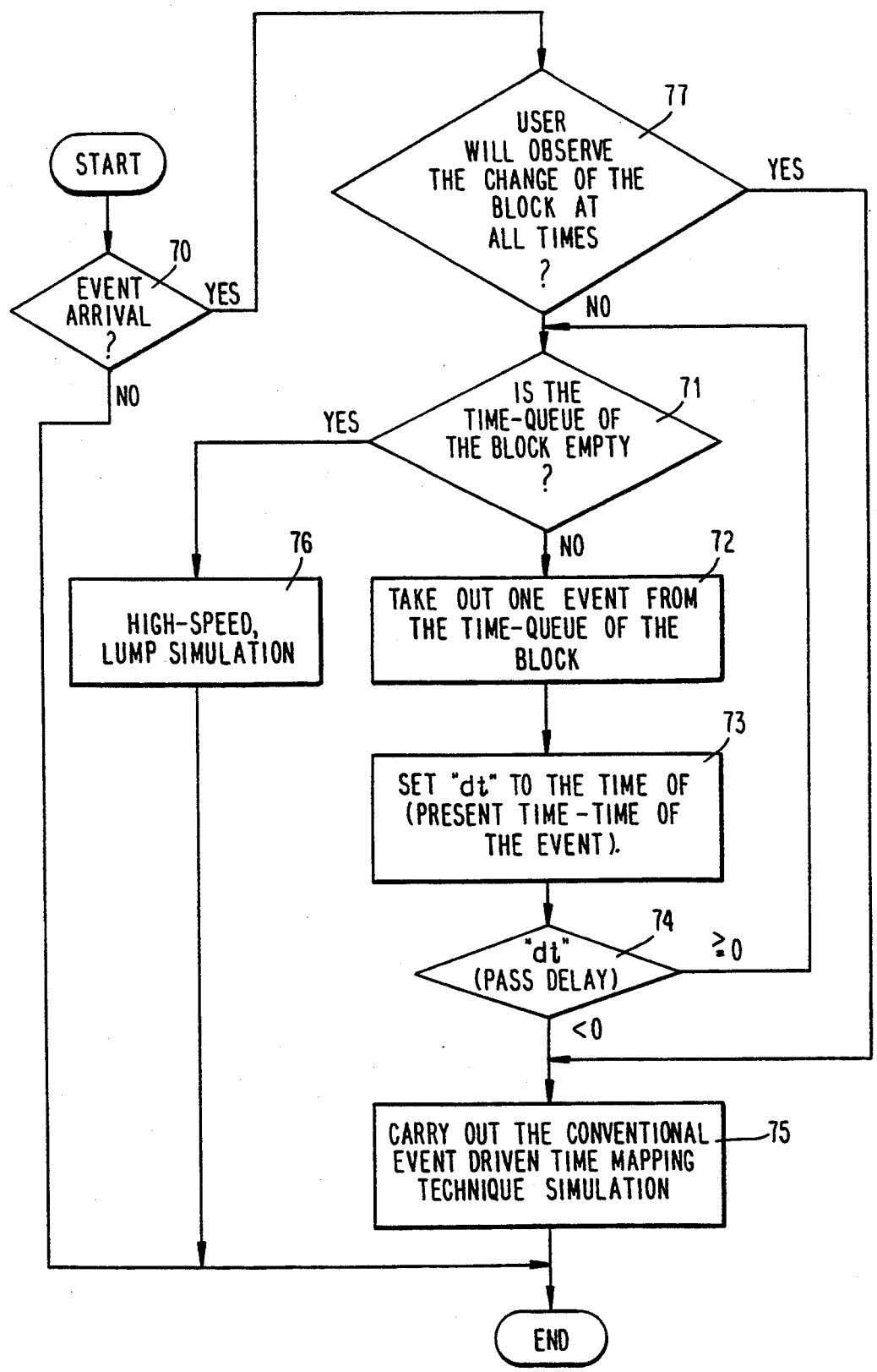

Referring to FIG. 7, block evaluation carried out as step 66 in the preceding figure, initially determines whether events have arrived at an input pin (step 70). If an event has not arrived, sequencing jumps to the end of the routine. On the other hand, if the user has supplied commands for obtaining detailed information during every time slot for part of or all the signals in the block (step 77), logic simulation is carried out with the local time queue in a conventional manner, and the entire and precise result of simulation is obtained (step 75).

Next, whether every event has been scheduled before the delay time between the input pin at which the event occurred and the output pin has transpired is investigated (see step 71–74). If so, all input signals to the block have fully propagated to the output of the block. The logic states of components within the block accordingly are not of interest, and it is unnecessary to calculate them using conventional simulation such as event driven simulation. Thus, if in the example of FIG. 10, $(t_1 - t_0) \geq (d_1, +d_2 + d_3)$, wherein $t_0$ is the time of an upcoming "event" and $t_1$ is the present time, high-speed collective simulation, e.g., by well known Boolean computation, is carried out; otherwise, handling is done in a conventional manner using event driven simulation.

Figure 5:
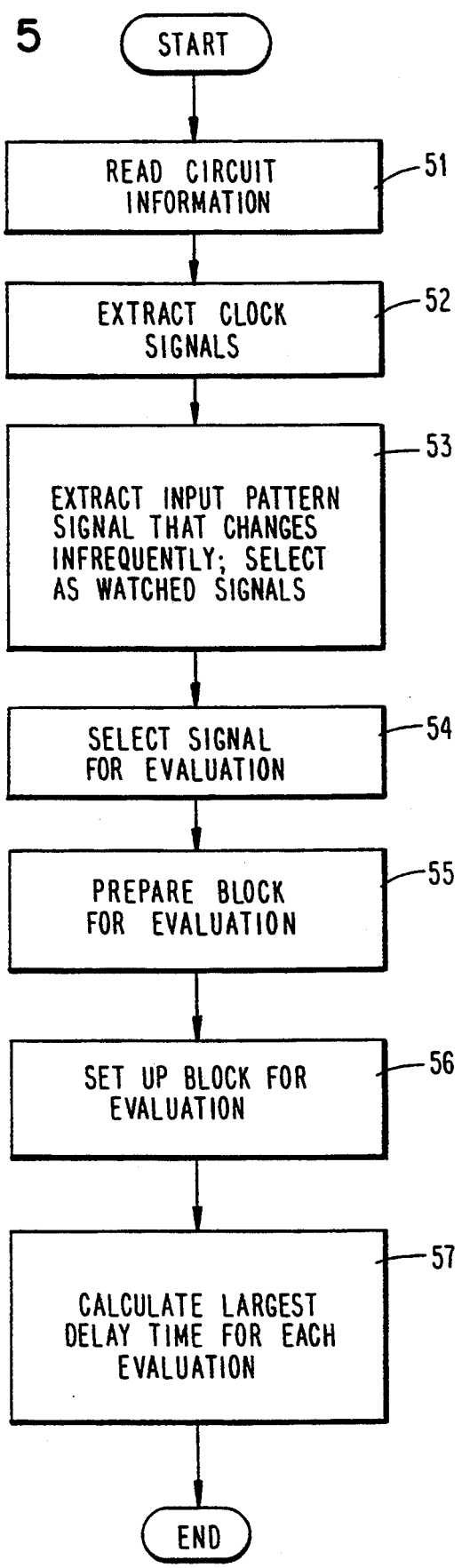
FIGS. 5, 6, 7, 8 are flow charts of programming for carrying out logic circuit simulation in accordance with the invention.
Figure 8:
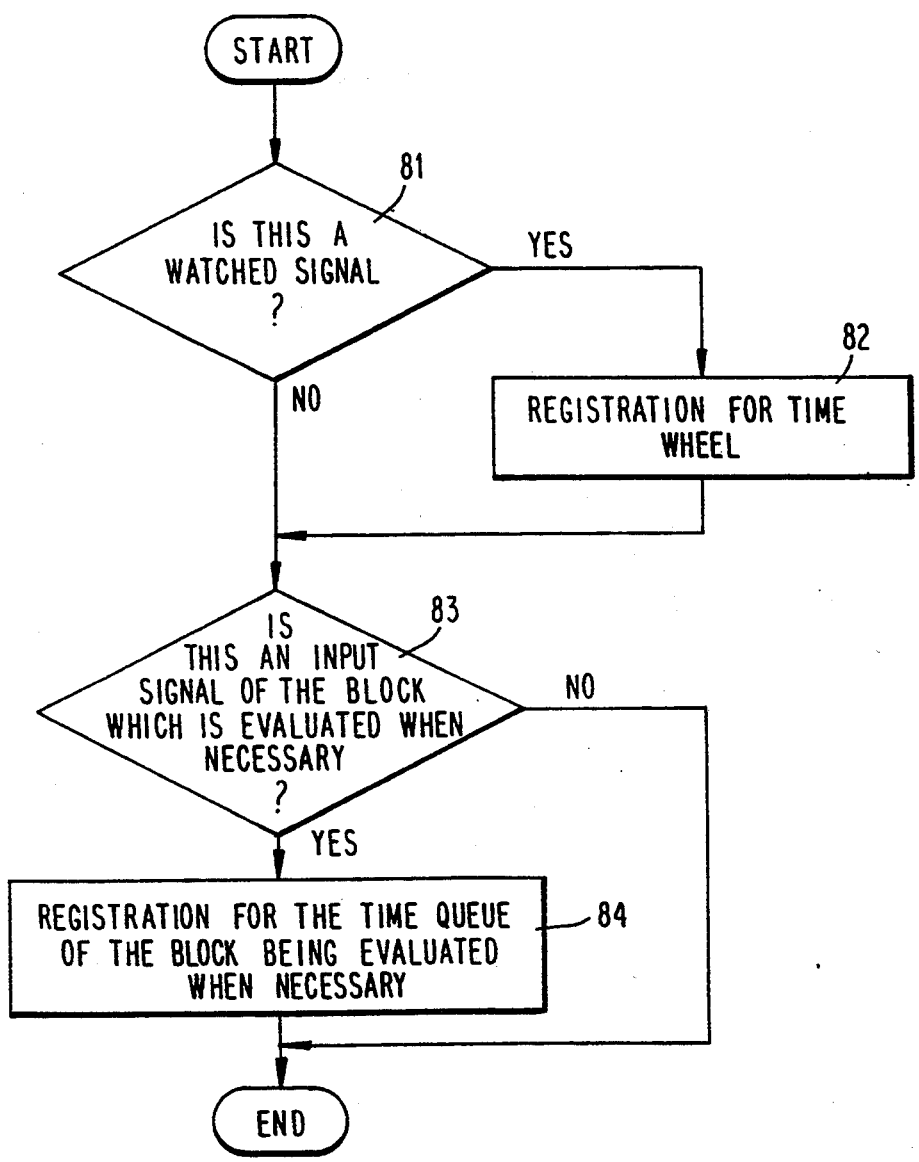

The routine of FIG. 8 executes scheduling called in step 67 of FIG. 5. Step 81 determines whether a destination of the output signal is a line carrying a watched signal. If so, the output signal is registered into the time-wheel (step 82). If not, i.e., the destination is an input signal to a block for evaluation, the output signal is registered into a time queue of the block (steps 83 and 84).

As a result of block processing by "lump" simulation rather than by time-wheel control wherein the state of each signal is determined for each time slot, processing is considerably reduced and a substantial number of calculations for each block is eliminated. Some increase in processing for the block time queue control at the borderline 10 of the block 406 will occur. However, as a whole, processing will be saved resulting in higher speed simulation as long as the number of the signals at the input is less than the number of signals in the block.

The procedure just described will be better understood with reference to the following recapitulation of logic simulation based upon the example of FIG. 10 together with corresponding time-wheel 400 depicted by FIG. 9. At time slot t=0 in the time-wheel 400, initial values for the input signals on lines (1), (7), (8) and (9) are established while delay values for the components shown are defined. In the present example, as was noted previously, the signals on input lines (1), (7), (8) and (9) have the initial values 0, 0, 1, 0, respectively. The delays are established as d1=3, d2 =5, d3=2, d4=5 and d5=1. The clock signal on line (1) is registered in the time-wheel 400. The input signal to the evaluation block 406 for performing an evaluation at the required time is registered in the local event queue of the block. The events 403, 404 and 405 are registered in the local event queue of the evaluation block for performing evaluation at the required time.

The maximum delay time of the evaluation block 406 is d1+d2+d3, i.e., 3+5+2=10. Since this block has been arranged to be evaluated according to a change of signal on line (1) from 0 to 1, as the watched signal, evaluation is performed by event 402 at time slot t=15 on the time-wheel. The difference between the maximum delay time and the actual time is computed to be 15−10=5. Every signal reaching the block 406 prior to time 5 has some effect on the output side of the block. Accordingly, for evaluation of the logic circuit at flip-flop 101, only signal values at time slot t=15 are required; there is no need to trace progress of signals throughout the block 406.

Thus, starting from the final input values of the block 406, simulation may be obtained sequentially without registration in the time-wheel by logical operation from the input side, i.e., the signals on line (7)=0, line (8)=1, line (9)=0, line (6)=0, line (5)=1, line (3)=0, line (4)=0 and line (2)=0. The signal on line (2), determined to be at 0, is the simulation output.

The logic simulation algorithm of the present invention accordingly reduces the amount of processing necessary for simulation of logic circuitry by dividing the circuitry not into hierarchical modules as in the semantics description method but as signals always to be watched and other signals to be evaluated upon a change of a watched signal to an activated logic state. The circuit is partitioned into evaluation blocks containing circuit components and lines carrying evaluation signals but not watched signals. Upon transition of a watched signal associated with the block into an activated logic state (i.e., an "event"), the block is evaluated by lump simulation. If the block is determined to be in a transient condition because all input signals have not fully propagated through it, conventional simulation is executed.

The method implemented in the present invention for simulation of the circut of FIG. 10 requires registration and simulation of five events, whereas simulation of the same circuit using prior art simulation, described earlier for FIG. 3, requires ten. The invention accordingly considerably reduces the amount of processing required for execution, resulting in higher speed simulation.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

I claim:

1. A computer-implemented method of simulating a logic circuit having a plurality of interconnected logic blocks, comprising the steps of:

receiving data describing the configuration of a logic circuit to be simulated;

identifying at least one signal having an input pattern that changes state at a rate less than a predetermined rate and classifying said at least one signal as a first signal which is always to be watched;

selecting for evaluation a group of second signals excluding said first signals;

evaluating states of said second signals only in response to a particular change of state of said first signal; and defining a plurality of blocks each comprising at least one component of said logic circuit and signal lines carrying at least one of said second signals but none of said first signals, said input pattern identified as having an input pattern that changes at a rate less than a predetermined rate being a clock signal pattern of said logic circuit, said step of evaluating including the steps of detecting an "event" in the form of a change in state of said first signal, removing the event from a time queue, determining whether the event satisfies a condition for evaluation, and if so, carrying out evaluation of said second signals for said block, and said step of carrying out an evaluation including the steps of
- (a) determining that an event has arrived at an input of a block,
- (b) in response to step (a), determining that a time queue contains at least one event,
- (c) if said time queue is determined to be empty of events, performing a lump simulation of said circuit, and
- (d) if said time queue is determined not to be empty of events, removing an event from said time queue, determining whether said event removed from said time queue is of a type for carrying out an evaluation, and in response,
- (d1) computing the largest delay time between input and output terminals of said block;
- (d2) determining whether the difference between the present time and the time of said event is less than said largest delay time; and if so
- (d3) performing a comprehensive block simulation.

2. A computer-implemented method of simulating a logic circuit having a plurality of interconnected logic blocks, comprising the steps of:

receiving data describing the configuration of a logic circuit to be simulated;

identifying at least one signal having an input pattern that changes state at a rate less than a predetermined rate and classifying said at least one signal as a first signal which is always to be monitored;

selecting for evaluation a group of second signals excluding said first signals;

defining at least one block comprising at least one component of said logic circuit and signal lines carrying at least one of said second signals but none of said first signals; and evaluating states of said second signals only in response to a particular change of state of said first signal designating a particular event, including
- (a) determining the maximum time delay associated with a signal propagating between input and output nodes of said block;
- (b) computing a time difference between a current time and the time of occurrence of said particular event;
- (c) if said time difference is less than said maximum delay time, performing a comprehensive simulation of logic circuitry contained by said block; and
- (d) if said time difference is equal to or greater than said maximum delay time, performing a lump simulation of said logic circuitry contained by said block.

3. A computer-implemented apparatus for simulating a logic circuit having a plurality of interconnected logic blocks, comprising:

means for receiving data describing the configuration of a logic circuit to be simulated;

means for identifying at least+one signal having an input pattern that changes state at a rate less than a predetermined rate and classifying said at least one signal as a first signal which is always to be monitored;

means for selecting for evaluation a group of second signals for excluding said first signals;

means for defining at least one block comprising at least one component of said logic circuit and signal lines carrying at least one of said second signals but none of said first signals; and means for evaluating states of said second signals only in response to a particular change of state of said first signal designating a particular event, said evaluating means including
- (a) means for determining the maximum time delay associated with a signal propagating between input and output nodes of said block, means for computing a time difference between a current time and the time difference between a current time and the time of occurrence of said particular event,
- (c) means for performing a comprehensive simulation of logic circuitry contained by said block if said time difference is less than said maximum delay time, and
- (d) means for performing a lump simulation of said logic circuitry contained by said block if said time difference is equal to or greater than said maximum delay time.

* * * * *